United States Patent [19]

Yoshinaga et al.

[11] Patent Number: 5,231,520
[45] Date of Patent: Jul. 27, 1993

[54] VOLUME PHASE TYPE HOLOGRAM AND METHOD OF MANUFACTURE THEREOF

[75] Inventors: Yoko Yoshinaga, Machida; Nobuo Kushibiki, Yamato; Tetsuro Kuwayama, Yokohama; Naosato Taniguchi, Atsugi, all of Japan

[73] Assignee: Canon Kabushiki Kaisha, Tokyo, Japan

[21] Appl. No.: 376,745

[22] Filed: Jul. 6, 1989

[30] Foreign Application Priority Data

Jul. 6, 1988 [JP] Japan ................................ 63-166885
Jul. 14, 1988 [JP] Japan ................................ 63-173894

[51] Int. Cl.$^5$ ............................................. G03H 1/04
[52] U.S. Cl. ........................................ 359/3; 359/1; 430/1; 430/2
[58] Field of Search ................... 350/3.6, 3.61; 430/1, 430/2; 359/1, 3, 32, 33

[56] References Cited

U.S. PATENT DOCUMENTS

| | | | |
|---|---|---|---|
| 3,560,210 | 1/1967 | Grobin, Jr. | 430/1 |
| 3,667,946 | 6/1972 | Sturdevant | 430/1 |
| 4,069,049 | 1/1978 | Reich et al. | 96/27 |
| 4,172,724 | 10/1979 | Matsumoto et al. | 350/3.61 |
| 4,173,474 | 11/1979 | Tanaka et al. | 350/3.61 |
| 4,201,441 | 5/1980 | Matsumoto et al. | 359/3 |
| 4,287,277 | 9/1981 | Matsumoto et al. | 350/3.61 |
| 4,517,266 | 5/1985 | Ikegami et al. | 430/2 |
| 4,722,037 | 1/1988 | Davis | 362/231 |
| 4,795,223 | 1/1989 | Moss | 359/24 |
| 4,854,674 | 8/1989 | Wreede | 350/3.7 |
| 4,856,857 | 8/1989 | Takeuchi et al. | 359/3 |
| 4,871,411 | 10/1989 | Kushibiki et al. | 350/3.61 |
| 4,892,369 | 1/1990 | Moss | 359/15 |
| 4,908,285 | 3/1990 | Kushibiki et al. | 350/3.61 |

FOREIGN PATENT DOCUMENTS

349982 1/1990 European Pat. Off. .

OTHER PUBLICATIONS

L. Solymar & D. J. Cooke, *Volume Holography and Volume Gratings*, Academic Press, New York, 1981, pp. 254-304.

Colburn, et al., "Volume Hologram Formation in Photopolymer Materials", *Applied Optics*, vol. 10, No. 7, pp. 1636-1641 (1971).

Patent Abstracts of Japan, vol. 10, No. 241 (P-488) [2297], Aug. 20, 1986 and JP-A-61 070 573 (Fujitsu) Apr. 11, 1986.

"Multicomponent photopolymer systems for volume phase holograms and grating devices", W. J. Tomlinson, et al., *Applied Optics*, vol. 15, No. 2, Feb. 1976.

*Primary Examiner*—Bruce Y. Arnold
*Assistant Examiner*—David R. Parsons
*Attorney, Agent, or Firm*—Fitzpatrick, Cella, Harper & Scinto

[57] ABSTRACT

A volume phase type hologram has a diffraction lattice recorded in a poly(N-vinyl carbazole) polymer layer where the diffraction lattice is recorded throughout the thickness direction of the polymer layer. A method for preparing the volume phase type hologram has the steps of exposing a photosensitive polymer layer provided on a substrate to an interference pattern; subjecting the polymer layer having been exposed to a first development treatment with a first organic solvent; and peeling the polymer layer off the substrate and subjecting the polymer to a second development treatment with a second organic solvent preferentially from the face that had been in contact with the substrate.

18 Claims, 2 Drawing Sheets

AFTER DEVELOPMENT BY EXPOSURE

AFTER PEELING AND FIXING

AFTER SECOND DEVELOPMENT

VOLUME PHASE TYPE HOLOGRAM AND METHOD OF MANUFACTURE THEREOF

BACKGROUND OF THE INVENTION

1. Field of the Invention

The present invention relates to a volume phase type hologram and a method of manufacture thereof.

2. Related Background Art

Gelatin sensitized by a dichromate has hitherto been widely known and used as a recording medium for volume phase type holograms. Another kind of recording medium is known for forming a volume phase type hologram comprising a hydrophobic polymer, exemplified by poly(N-vinylcarbazole), (hereinafter referred to as PVCz), sensitized by addition of an iodine compound, and volume phase type holograms recorded in the above recording mediums are also known, which are disclosed in detail in prior art publications such as U.S. Pat. No. 4,172,724, U.S. Pat. No. 4,258,111 and U.S. Pat. No. 4,287,277.

The volume phase type hologram is employed for recording the interference pattern of laser beams in a thin film of 20 μm thick or less. When using a visible light laser, the layer of photosensitive material for hologram recording is required to be fixed with positional accuracy of approximately from 0.01 to 0.02 μm during exposure in order to record a Bragg's lattice of approximately 0.1 to 0.2 μm interstice within a film.

Further, in the treatment subsequent to the exposure, the photosensitive recording layer is swollen and then shrunk to modulate the refractive index of the portion recorded by laser beam, where the swelling and then the shrinking of the recording layer are in a direction substantially perpendicular to the recording layer. Because of this restriction both in light exposure and in after-treatment, conventional volume phase type holograms are tightly fixed on and supported on a rigid substrate plate.

The above-mentioned conventional methods involve a disadvantage in that a diffraction lattice cannot be formed satisfactorily in the recording layer in proximity to an interface of the substrate, because the recording layer is supported and fixed by the substrate surface and therefore a solvent cannot penetrate sufficiently to cause the necessary swelling and shrinking even though a latent image has been formed in the recording layer near the substrate by exposure.

To offset this disadvantage, the use of a solvent having a high swelling power may be considered. However, such a solvent weakens the fixation of the recording layer to the substrate, and makes it impossible to restrict the direction of swelling and shrinking of the recording layer only to the thickness direction; thus the formation of a desired diffraction pattern becomes difficult. To solve this problem, Japanese Patent Laid-open Application, Publication No. 62-502289 (1987) proposes a method in which the photosensitivity at the recording layer is reduced in the vicinity of the interface to the substrate so as to retard the formation of a lattice image near the interface. In this instance, the region which practically serves as a hologram in a limited thickness of the recording layer decreases.

SUMMARY OF THE INVENTION

An object of the present invention is to provide a volume phase type hologram and a method of manufacture thereof, free from the above-mentioned disadvantages of the prior art.

According to an aspect of the present invention, there is provided a volume phase type hologram having a diffraction lattice recorded in a polymer layer, said diffraction lattice being recorded throughout the thickness of the polymer layer.

According to another aspect of the present invention, there is provided a method for preparing a volume phase type hologram, comprising the steps of exposing a photosensitive polymer layer provided on a substrate to an interference pattern; subjecting the polymer layer having been exposed to a first development treatment with a first organic solvent; and peeling the polymer layer off the substrate and subjecting the polymer to a second development treatment with a second organic solvent preferentially from of the face that had been in contact with the substrate.

DETAILED DESCRIPTION OF THE PREFERRED EMBODIMENT

Figure 1:
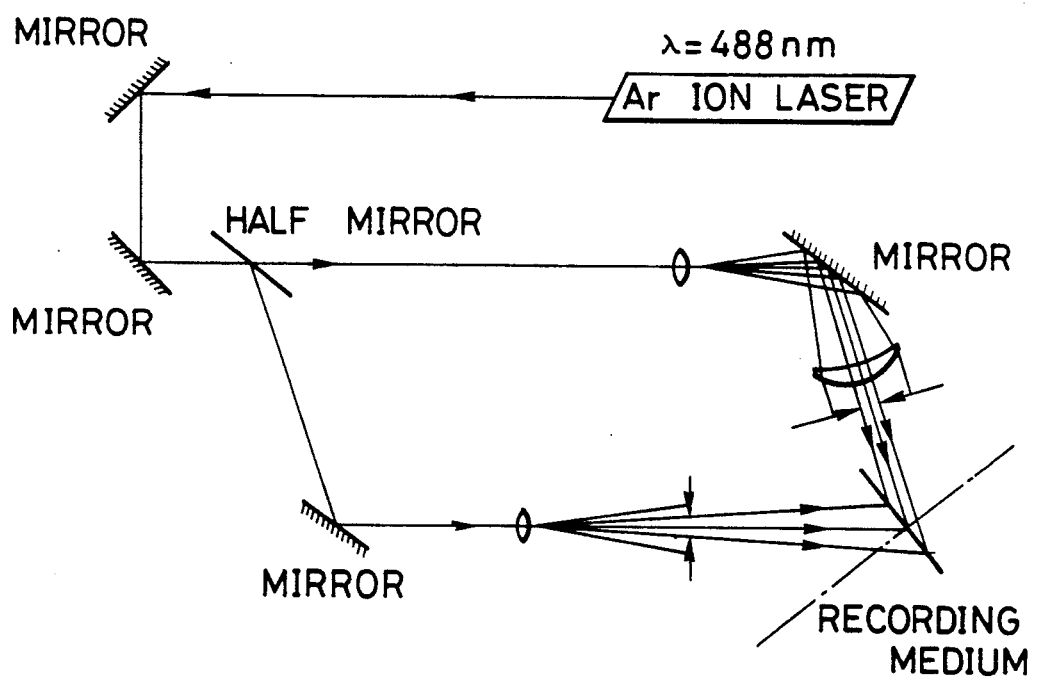
FIG. 1 is a sketch of an optical system for exposure employed in the Examples of the present invention.

The present invention provides a volume phase type hologram having a diffraction lattice recorded throughout the thickness of the recording layer according to the steps of forming a hologram-recording layer from a polymer capable of forming a high-strength film, exposing and developing the recording layer conventionally, peeling the recording layer off, or removing the recording layer from the substrate, and again developing the face of the recording layer having been in contact with the substrate during the previous developing step.

Although a latent hologram image is formed by exposure throughout the thickness of the recording layer, the image is not developed in the vicinity of the interface with the substrate because of the inability of solvents to penetrate thereto. The diffraction lattice can be formed uniformly throughout the thickness of the recording layer, if, after a first developing step, the recording layer is peeled off the substrate and the undeveloped portion (or the recording layer in the vicinity of the substrate) is again subjected to development in a second developing step.

A PVCz polymer preferably employed in the present invention is generally prepared by polymerization of N-vinylcarbazole. The PVCz prepared in a conventional procedure or purchased from the market is applicable in the present invention. However, the conventional PVCz is preferably purified, for example, by molecular-weight fractionation by a solvent to separate off a low molecular fraction and to increase the molecular weight of the remaining PVCz.

A comprehensive study by the present inventors revealed that when the particularly preferable PVCz has a weight-average molecular weight of 1,000,000 (Mw) or more and the molecular-weight distribution (Mw/Mn) of 3 or less, its as a recording medium in a volume phase type hologram of the present invention solves the various aforementioned problems. In particular, those having a molecular-weight distribution of 2 or less, those containing PVCz of weight-average molecular weight of 200,000 or less at a content of not more than 1% by weight, and those containing PVCz having a weight-average molecular weight of at least 1,000,000 at a proportion of 50% by weight of the whole polymer will more advantageously accomplish the object of the present invention.

The weight-average molecular weight and molecular-weight distribution described in the present invention are obtained by gel permeation chromatography in tetrahydrofuran, as polystyrene calibration standard values, at a column temperature of 27° C. The columns used were a successive combination of SHODEX® KF-807 and KF80M (made by Showa Denko K.K.), in accordance with a polystyrene calibration using standard polystyrene of from $2 \times 10^7$ to $1.2 \times 10^3$ of average molecular weight.

A procedure for molecular weight fractionation is explained below as one of the embodiments of preparing PVCz of a preferable high molecular weight.

Any known conventional molecular-weight fractionation method is applicable to the fractionation, such as the use of various solvents having different dissolving power toward PVCz, and a change of the concentration. As an example, the mixing ratio of a good solvent (dioxane) to a poor- or non-solvent (isopropyl alcohol) was varied to change the dissolving power of the mixed solvent toward the PVCz, and a low molecular fraction was removed by dissolution-precipitation fractionation.

The method of manufacturing the volume phase type hologram, of the present invention is explained below employing the above-mentioned PVCz.

The PVCz has no light absorption band at the wavelength region longer than 400 nm, so it must be activated with respect to radiation in the visible wavelength region by adding a halogen compound, preferably an iodine compound and/or a bromine compound as a photosensitizer.

The halogen compounds act as good sensitizers toward PVCz for the visible wavelength region. Specifically the preferable carbon-halogen compounds contain iodine and bromine such as carbon tetraiodide, iodoform, tetraiodoethylene, triiodoethane, tetraiodoethane, pentaiodoethane, hexaiodioethane, carbon tetrabromide, and tetrabromoethylene. The halogen compound is added in an amount of 0.01 to 1 part by weight per 1 by weight of the aforementioned PVCz.

Adding too small an amount of the halogen compound is not favorable because it lowers the sensitivity of the recording medium and prolongs the required exposure time, while adding a larger amount of the halogen compound, exceeding 1 in the weight ratio is unfavorable because it causes voids in the resulting hologram film after development of hologram.

Additionally, addition of a plasticizer is not preferable in the preparation of the recording medium of the present invention. If a plasticizer is present, the remaining unextracted plasticizer must be swollen and shrunk with the PVCz in the swelling and shrinking processes in the image development, and may bring about an undesired refraction index distribution, in addition to the modulation of refraction index that satisfies the Bragg condition in the recording medium after shrinkage. However, the use of a plasticizer is not necessarily prohibited within the range where such inconvenience does not arise.

The hologram recording medium employed in the present invention is obtained by dissolving or dispersing the above-mentioned PVCz, a halogen compound and any other necessary additive in a desired proportion, in an appropriate solvent, and then applying it on onto a transparent substrate such as a glass plate or a plastic film, where the applied coating film has a thickness in the range of 5 μm to 15 μm (dry thickness).

The recording medium thus formed is exposed to two interfering laser beams of coherent visible light of wavelength up to 560 nm by means of an optical system illustrated in FIG. 1.

Subsequent to the exposure, the recording medium is immersed in a solvent which hardly extracts the PVCz, constituting the recording layer, or the crosslinked PVCz formed by photoreaction, removing solely the unreacted halogen compound nearly completely by elution, and eliminating color from the recording layer. This step can also serve as a swelling step as mentioned below.

A second development process comprises the two steps of swelling and shrinking.

The recording layer carrying a latent hologram image, formed by the aforementioned light exposure, and having been made free from the halogen compound, is treated with a first solvent to cause the recording layer to swell in the direction of the thickness of the recording layer. In the subsequent treatment with a second solvent, the recording layer in a swollen state is shrunk to fix the hologram in the recording layer.

Figure 2A:
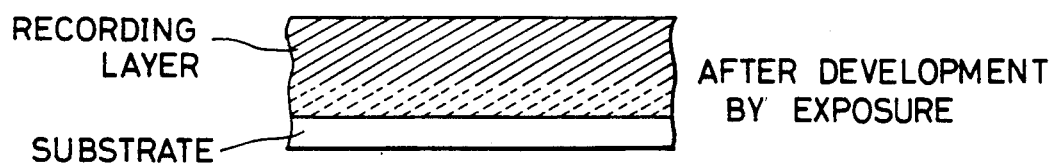
FIG. 2A, FIG. 2B, and FIG. 2C respectively outline the method of manufacture of the present invention.

In this state, the recorded interference pattern remains undeveloped in the vicinity of the interface in contact with the substrate as shown schematically in FIG. 2A.

The first solvent, serving as a liquor for swelling in the hologram developing step, is the one which dissolves out within a short time neither the uncrosslinked PVCz nor the crosslinked PVCz after the photoreaction between the PVCz and the halogen compound. This solvent is preferably an organic solvent having a solubility of PVCz equal to or lower than the organic solvent employed in the purification of the PVCz mentioned above, and is selected from the organic solvents which are useful for the purification process.

The second solvent, serving as a liquor for the shrinking treatment, may be any solvent which does not swell nor dissolve the recording layer and is compatible with the above-mentioned swelling liquor.

The solvent or the solvent combination is chosen from non- or poor solvents of PVCz.

The treatment conditions, such as temperature and time length of each of the steps depend on the kind of recording layer or the solvent, etc., and cannot simply be specified. Generally, each step achieves a sufficient effect at a temperature of 10°–70° C. for several seconds to several minutes.

In the present invention, the recording layer of the volume phase type hologram as described above is once peeled off the transparent substrate. Any method may be applied which does not impair the recording layer such as a method of peeling by immersion in water, or an aforementioned non-solvent.

Figure 2B:
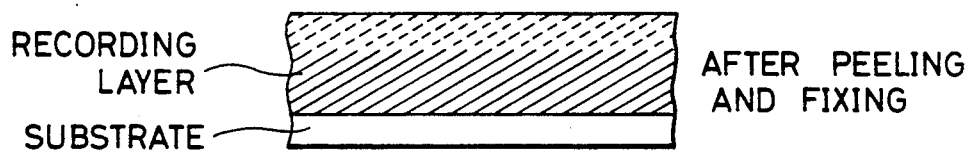

The object of the present invention is accomplished by re-treating the recording layer separated from the transparent substrate with solvents for swelling and shrinking respectively. In the retreatment, the recording layer is preferably fixed again on a solvent-resistant substrate such as a glass plate, in such a manner that the face having been in contact with the transparent substrate prior to the peeling is brought to the external side as shown schematically in FIG. 2B, so as to prevent the swelling and the shrinking of the recording layer in a planar direction. In fixing the recording layer to the solvent-resistant substrate, an adhesive such as epoxy type, urethane type, and α-cyanoacrylate type, which is transparent and does not impair the recording layer may be used.

Figure 2C:
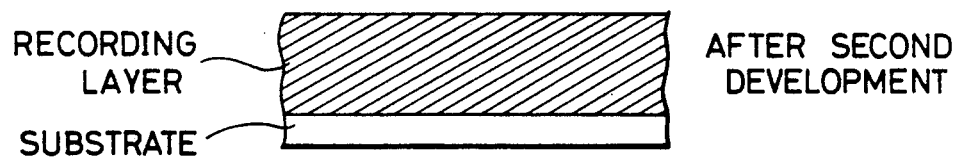

The subsequent solvent treatment may be conducted in the same manner as that described above. In particular, the use of the same solvent and the same conditions as described above are desirable in order to maintain the uniformity of the lattice. In this retreatment, the treatment of only the surface and the vicinity thereof which has not been sufficiently developed is enough, since the major portion of the recording layer has already been well developed. Such re-treatment will complete the volume phase type hologram having a recorded diffraction lattice throughout the thickness direction of the recording layer as shown schematically in FIG. 2C.

The above-described manufacturing method may be modified as described below. In this modification, the secondary developing treatment is conducted under different conditions from that of the primary swelling and shrinking treatment. For example, the use of a solvent having a swelling power stronger than the primary swelling solvent, or the adoption of higher temperature or longer time with the same solvent, allows formation of a new lattice which diffracts light of a longer wavelength than the diffraction pattern resulting from the primary development. Contrarily, use of a solvent with a lower swelling power than the primary swelling solvent treatment allows the formation of a lattice diffracting a shorter wavelength of light than the primary lattice.

Additionally, the hologram thus prepared may naturally be used with the substrate adhered. Further, the holograph film as peeled off the substrate is useful for various uses since the PVCz employed in the present invention is of so high a molecular weight that the film itself as peeled off again still has sufficient self-supporting strength.

According to the present invention, a volume phase type hologram is provided which has a diffraction lattice recording uniformly throughout the direction of the thickness of the recording layer by the steps of forming a recording layer from a polymer capable of forming a high-strength film, exposing and developing it conventionally, peeling the recording layer off the substrate to remove it, and then again subjecting the surface having been in contact with the substrate to a developing treatment.

The volume phase type hologram of the present invention is improved to exhibit a maximum diffraction efficiency of 99.9%, transmissivity of not less than 92% at 600 nm, and haze of not more than 2% for 10 μm thickness, in comparison with the corresponding values of 98%, 80%, and 12%, respectively of the conventional volume phase type hologram employing PVCz.

The present invention is described more specifically referring to the examples.

EXAMPLE 1

20 grams of PVCz (RUBICAN® M-170 made by BASF) was put into 600 ml of a mixed solvent of dioxane/isopropyl alcohol (weight ratio: 3/1), heated to 80° C. to prepare a homogeneous solution, and then cooled to room temperature. The precipitated PVCz was separated by decantation, and the separated PVCz was washed several times by agitating with 200 ml portions of dioxane/isopropyl alcohol mixture (weight ratio: 3/1) to obtain purified PVCz.

A portion of the obtained purified PVCz was dissolved in tetrahydrofuran, and tested for weight-average molecular weight and molecular-weight distribution by means of gel permeation chromatography at 27° C. employing a combination of columns of SHODEX® KF-807 and KF80M, (made by Showa Denko K.K.), with polystyrene (made by Showa Denko K.K.) as the standard. The weight-average molecular weight was 1,520,000, and the molecular-weight distribution was 1.48. The content of PVCz having a molecular weight of not higher than 200,000 was 0.8% by weight, and the content of PVCz having a molecular weight of not less than 1,000,000 was 62% by weight.

2.5 grams of this purified PVCz and 0.25 gram of carbon tetraiodide were put into 40 ml of chlorobenzene and dissolved in the dark, and the liquid was applied onto a cleaned glass plate by means of a spinner (made by Kyowa Semiconductor K.K.) and dried to form a recording layer 7.2 μ thick.

The recording layer was subjected to exposure by means of an optical system as illustrated in FIG. 1 employing an argon (Ar) laser (488 nm) to record a hologram thereon.

After the exposure, it is immersed in toluene at 35° C. for 2 minutes, in xylene at 35° C. for 2 minutes, and further in heptane at 20° C. for 2 minutes, dried to obtain a volume phase type hologram.

After immersion in water in water for 30 minutes, the volume phase type hologram film became separated from the substrate. The separated film was scooped from the water by using a polyester film having a surface tension of 40 dyne/cm as measured according to JIS K-6768, in such manner that the face of the hologram film having been in contact with the glass substrate is brought into contact with the polyester film, and then it was dried.

The resulting hologram had a diffraction peak at 520 nm, and exhibited a maximum diffraction efficiency of 98%, a diffraction peak breadth of 18 nm, and transmissivity of 85% at 600 nm.

The hologram was stuck on a glass plate previously coated with an epoxy-adhesive, and subjected to the developing treatment similar to a above to obtain the volume phase type hologram of the present invention.

The maximum reflective diffraction efficiency of the obtained hologram was measured in the same manner as above and was found to be 99.9%. The transmissivity was 95%. The haze (total haze value) was 1.3% by means of a haze meter (made by Nippon Denshoku K.K.) according to JIS K7105.

The hologram was kept in a nitrogen atmosphere at 140° C. for approximately 5 hours. The hologram characteristics were measured by means of the above-described optical system. Little shift of the peak of the maximum diffraction efficiency was observed, and also little change in the transmissivity and the haze value were observed.

EXAMPLE 2

2.5 grams of PVCz having a weight-average molecular weight of 1,520,000 and a molecular-weight distribution of 1.48, and 0.25 gram of carbon tetraiodide were dissolved in chlorobenzene in the dark. The solution was applied on a cleaned glass plate by means of a spinner (made by Kyowa Semiconductor K.K.), and it was dried to form a recording layer 7.2 μm thick. In this recording layer, a hologram was recorded by exposure to an Argon (Ar) laser (488 nm) by using the optical system illustrated in FIG. 1.

After the exposure, it is immersed in toluene at 35° C. for 2 minutes, in xylene at 35° C. for 2 minutes, and further in heptane at 20° C. for 2 minutes, and dried to obtain a volume phase type hologram.

After immersion in water for 30 minutes, the volume phase type hologram film became separated from the substrate. The film was scooped out from the water by using a polyester film having a surface tension of 40 dyne/cm as measured according to JIS K-6768 in such a manner that the face of the hologram film having been in contact with the glass substrate is brought into contact with the polyester film, and dried. The hologram film was then stuck to a glass plate on which an epoxy-adhesive had been applied, and was adhered thereto and dried.

It is then immersed in toluene at 30° C. for 1 minute, in xylene at 30° C. for 1 minute, and further in heptane at 20° C. for 1 minute, and dried to obtain a volume phase type hologram of the present invention.

The reflection diffraction efficiency of the above-described hologram was measured to be 83% at 520 nm, and 42% at 490 nm.

EXAMPLE 3

A volume phase type hologram was prepared from a recording medium similar to that of Example 2 by exposing it to light, immersing it in toluene at 30° C. for 2 minutes, in xylene at 30° C. for 2 minutes, and further in hexane at 18° C. for 2 minutes. The hologram exhibited a maximum diffraction efficiency at 495 nm, diffraction peak breadth of 23 nm, and transmissivity of 83%.

The hologram was treated in the same manner as in Example 2 for film separation and re-fixing. It was then immersed in dioxane at 35° C. for 1 minute and in ethyl ether at 15° C. for 1 minute to obtain the volume phase type hologram of the present invention.

The hologram had diffraction peaks of 78% at 495 nm, and 52% at 590 nm as the result of reflective diffraction efficiency measurement.

We claim:

1. A volume phase type hologram having a diffraction lattice recorded in a poly(N-vinyl carbazole) polymer layer, said diffraction lattice being recorded throughout the thickness of the polymer layer.

2. The volume phase type hologram of claim 1, wherein the polymer layer has a thickness in the range from $5\mu$ to $15\mu$.

3. The volume phase type hologram of claim 1, wherein the polymer has a weight-average molecular weight of not less than 1,000,000 and a molecular-weight distribution of not more than 3.

4. The volume phase type hologram of claim 1, wherein the polymer layer is supported by a substrate.

5. The volume phase type hologram of claim 4, wherein the polymer layer is distinct from and formed upon the substrate.

6. The volume phase type hologram of claim 1, wherein the polymer layer is supported by a substrate with interposition of an adhesive.

7. The volume phase type hologram of claim 1, wherein the polymer layer has a uniform thickness throughout.

8. A volume phase type hologram having a diffraction lattice recorded in a poly (N-vinyl carbazole) polymer layer, said diffraction lattice being recorded throughout the thickness of the polymer layer; and wherein the hologram has diffraction peaks at two different wavelengths.

9. A method for preparing a volume phase type hologram, comprising steps of exposing a photosensitive poly(N-vinyl carbazole) polymer layer provided on a substrate to an interference pattern; subjecting the polymer layer having been exposed to a first development treatment with a first organic solvent; and removing the polymer layer from the substrate and subjecting the polymer to a second development treatment with a second organic solvent on at least the polymer surface which had been in contact with the substrate.

10. The method of claim 9, wherein the polymer layer removed is attached to the substrate with a face opposite to the side that had been in contact with the substrate, and then the polymer layer is subjected to said second development treatment.

11. The method of claim 9, wherein the substrate is a glass plate.

12. The method of claim 9, wherein the polymer layer is swollen and shrunk in both of the first and the second development treatments.

13. The method of claim 9, wherein the first and the second development treatments are conducted under the same development conditions.

14. The method of claim 9, wherein the first and the second treatments are conducted respectively under different development conditions.

15. The method of claim 9, wherein the polymer layer has a thickness in the range from 5 $\mu$m to 15 $\mu$m.

16. The method of claim 9, wherein the polymer has a weight-average molecular weight of not less than 1,000,000 and a molecular-weight distribution of not more than 3.

17. The method of claim 9, wherein the photosensitive polymer is sensitive in the visible wavelength spectrum.

18. The method of claim 9, wherein the polymer layer is removed by immersion in water.

* * * * *